United States Patent
Liu et al.

(10) Patent No.: US 12,451,353 B2
(45) Date of Patent: Oct. 21, 2025

(54) DOUBLE HARDMASKS FOR SELF-ALIGNED MULTI-PATTERNING PROCESSES

(71) Applicant: Tokyo Electron Limited, Tokyo (JP)

(72) Inventors: Eric Chih-Fang Liu, Albany, NY (US); Christopher Cole, Albany, NY (US); Steven Grzeskowiak, Albany, NY (US); Katie Lutker-Lee, Albany, NY (US); Xinghua Sun, Albany, NY (US); Daniel Santos Rivera, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 328 days.

(21) Appl. No.: 17/879,873

(22) Filed: Aug. 3, 2022

(65) Prior Publication Data
US 2024/0047210 A1    Feb. 8, 2024

(51) Int. Cl.
*H01L 21/033* (2006.01)
*H01L 21/02* (2006.01)
*H01L 21/308* (2006.01)
*H01L 21/311* (2006.01)
*H01L 21/3213* (2006.01)

(52) U.S. Cl.
CPC .... *H01L 21/0332* (2013.01); *H01L 21/02164* (2013.01); *H01L 21/0217* (2013.01); *H01L 21/0337* (2013.01); *H01L 21/0338* (2013.01); *H01L 21/3081* (2013.01); *H01L 21/3086* (2013.01); *H01L 21/3088* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| 8,883,649 B2 | 11/2014 | Yin et al. |
| 9,257,280 B2 | 2/2016 | Ko et al. |
| 9,379,017 B1 * | 6/2016 | Sung ............... H01L 21/823431 |
| 9,812,325 B2 | 11/2017 | Mohanty et al. |

(Continued)

OTHER PUBLICATIONS

Liu et al., "Line Edge Roughness (LER) Reduction Strategies for EUV Self-Aligned Double Patterning (SADP)," Proceedings vol. 11615, Advanced Etch Technology and Process Integration for Nanopatterning X; 1161506, Apr. 9, 2021, https://doi.org/10.1117/12.2582556, 11 pages.

*Primary Examiner* — Jiong-Ping Lu
(74) *Attorney, Agent, or Firm* — Slater Matsil, LLP

(57) ABSTRACT

A method of processing a substrate that includes: forming recesses in a first mask layer over a mask stack including a lower hardmask, a middle mask, and an upper hardmask, the recesses defining an initial pattern including a plurality of spacer structures, each of the spacer structures having a first sidewall and an opposite second sidewall, the first sidewall having a different height from the second sidewall; etching the upper hardmask, selectively to the middle mask, to transfer the initial pattern to the upper hardmask; etching the middle mask, selectively to the lower hardmask and the patterned upper hardmask, to transfer a pattern of the patterned upper hardmask to the middle mask; and etching the lower hardmask, selectively to the patterned middle mask, to transfer a pattern of the patterned middle mask to the lower hardmask.

20 Claims, 7 Drawing Sheets

(56) References Cited

U.S. PATENT DOCUMENTS

| | | | |
|---|---|---|---|
| 2007/0128856 A1* | 6/2007 | Tran | H01L 21/0338 |
| | | | 257/E21.235 |
| 2014/0024219 A1* | 1/2014 | Jung | H01L 21/0337 |
| | | | 257/E21.215 |
| 2018/0061640 A1 | 3/2018 | Liu et al. | |
| 2018/0090335 A1* | 3/2018 | Karve | H01L 21/3086 |
| 2021/0398858 A1* | 12/2021 | Pan | H10B 41/27 |

* cited by examiner

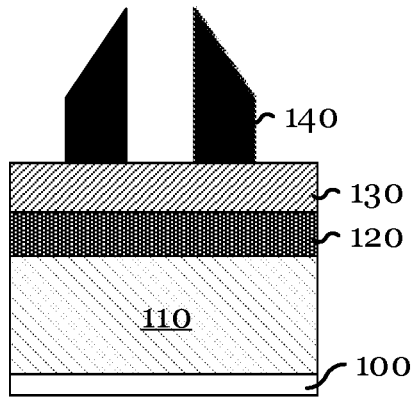
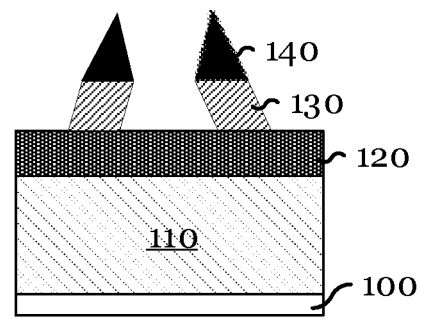
FIG. 1A
(PRIOR ART)
FIG. 1B
(PRIOR ART)
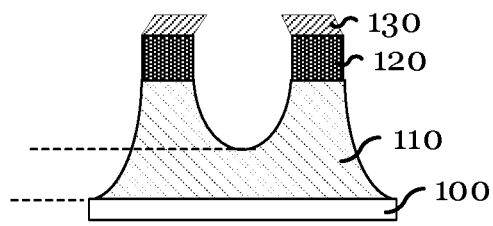
FIG. 1C
(PRIOR ART)

DOUBLE HARDMASKS FOR SELF-ALIGNED MULTI-PATTERNING PROCESSES

TECHNICAL FIELD

The present invention relates generally to a method of processing a substrate, and, in particular embodiments, to double hardmask for self-aligned multi-patterning processes.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

The minimum dimension of features in a patterned layer is shrunk periodically to roughly double the component density at each successive technology node, thereby reducing the cost per function. Innovations in patterning, such as immersion deep ultraviolet (i-DUV) lithography, multiple patterning, and 13.5 nm wavelength extreme ultraviolet (EUV) optical systems have brought some critical dimensions down close to ten nanometers. This squeezes the margin for pattern misalignment and puts pressure on process integration to provide self-aligned structures to prevent electrical opens and shorts in middle-of-line (MOL) and back-end-of-line (BEOL) interconnect elements. Innovative process flows for fabricating self-aligned structures may rely on availing highly selective etch and deposition processing techniques, thereby challenging semiconductor processing technology such as plasma enhanced deposition and etching to innovate and provide the requisite unit processes with the nanoscale precision, uniformity, and repeatability that IC manufacturing demands.

SUMMARY

In accordance with an embodiment of the present invention, a method of processing a substrate that includes: forming recesses in a first mask layer over a mask stack including a lower hardmask, a middle mask, and an upper hardmask, the recesses defining an initial pattern including a plurality of spacer structures, each of the spacer structures having a first sidewall and an opposite second sidewall, the first sidewall having a different height from the second sidewall; etching the upper hardmask, selectively to the middle mask, to transfer the initial pattern to the upper hardmask; etching the middle mask, selectively to the lower hardmask and the patterned upper hardmask, to transfer a pattern of the patterned upper hardmask to the middle mask; and etching the lower hardmask, selectively to the patterned middle mask, to transfer a pattern of the patterned middle mask to the lower hardmask.

In accordance with an embodiment of the present invention, a method of self-aligned multiple patterning that includes: performing a lithographic process to pattern a photoresist layer formed over a layer stack including a mandrel layer, a dielectric layer, and an anti-reflective coating (ARC) layer over the substrate, the substrate further including, below the mandrel layer, a lower hardmask layer, a middle mask layer, and an upper hardmask layer; performing a pattern transfer etch to etch through the dielectric layer and the ARC layer and pattern the mandrel layer; depositing a spacer material over the patterned mandrel layer; removing a top portion of the deposited spacer material to expose top surfaces of the patterned mandrel layer; removing the patterned mandrel layer to form free-standing sidewall spacers; etching the upper hardmask layer selectively to the middle mask layer and transfer a pattern of the free-standing sidewall spacers to the upper hardmask; etching the middle mask layer selectively to the lower hardmask layer and the patterned upper hardmask layer and transfer a pattern of the patterned upper hardmask layer to the middle mask layer; and etching the lower hardmask layer selectively to the patterned middle mask layer and transfer a pattern of the patterned middle mask layer to the lower hardmask layer.

In accordance with an embodiment of the present invention, a method of self-aligned multiple patterning that includes: forming sidewall spacers on sidewalls of a mandrel over the substrate, the mandrel formed over a mask stack including a lower hardmask layer, a middle mask layer, and an upper hardmask layer, the lower hardmask layer and the upper hardmask layer are a same material, the sidewall spacers and the middle mask layer are another same material; etching the mandrel to release the sidewall spacers to form free-standing sidewall spacers; etching the upper hardmask layer selectively to the middle mask layer and transfer a pattern of the free-standing sidewall spacers to the upper hardmask; etching the middle mask layer selectively to the lower hardmask layer and the patterned upper hardmask layer and transfer a pattern of the patterned upper hardmask layer to the middle mask layer; etching the lower hardmask layer selectively to the patterned middle mask layer and transfer a pattern of the patterned middle mask layer to the lower hardmask layer; and forming recesses by etching an underlying layer below the mask stack using the patterned lower hardmask layer as an etch mask.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C illustrate cross-sectional views of an example substrate during a conventional self-aligned double patterning (SADP) process at various stages, wherein FIG. 1A illustrates the substrate with tapered sidewall spacers, FIG. 1B illustrates the substrate after patterning a hardmask layer, and FIG. 1C illustrates the substrate after patterning an underlying layer;

FIGS. 2A-2I illustrate cross-sectional views of an example substrate during a SADP process utilizing double hardmask at various stages of processing in accordance with various embodiments, wherein FIG. 2A illustrates an incoming substrate, FIG. 2B illustrates the substrate after forming mandrels, FIG. 2C illustrates the substrate after depositing a spacer material over the mandrels, FIG. 2D illustrates the substrate after a top hat etch, FIG. 2E illustrates the substrate after a mandrel pull etch, FIG. 2F illustrates the substrate after a first hardmask etch, FIG. 2G illustrates the substrate after a middle mask etch, FIG. 2H illustrates the substrate after a second hardmask etch, and FIG. 2I illustrates the substrate after a final pattern transfer etch; and FIGS. 3A-3C illustrate process flow charts of methods of double hardmask in accordance with various embodiments, wherein FIG. 3A illustrates an embodiment, FIG. 3B illustrates another embodiment, and FIG. 3C illustrates yet another embodiment.

DETAILED DESCRIPTION OF ILLUSTRATIVE EMBODIMENTS

Figure 2A:
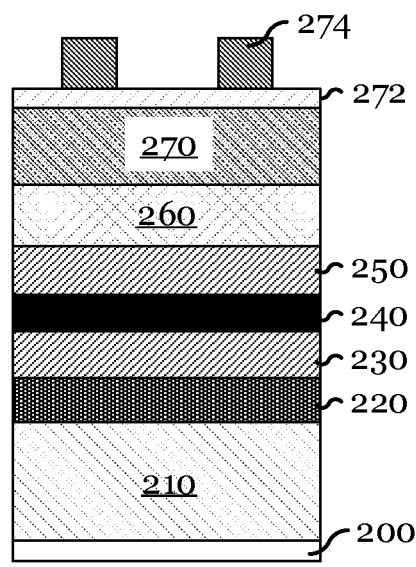

This application relates to methods of processing a substrate, more particularly to double hardmask for self-aligned multi-patterning processes. As the semiconductor technology node continues to shrink, the requirement for precise placement of features (e.g., metal lines, contacts, and vias) becomes increasingly more stringent. Various multiple patterning techniques such as self-aligned double patterning (SADP) enable fabrication at small scales, even below the resolution limit of photolithography, by utilizing spacer formation on the sidewalls of the first feature defined by photolithography (e.g., mandrel). However, a typical SADP process often leads to tapered spacer profiles, which may then result in leaned mask profile. The leaned mask profile worsens the subsequent patterning performance, and final features formed thereafter may suffer from pitch walking, critical dimension (CD) variations, high line edge roughness (LER), and high recess depth variation among others. Therefore, methods of correcting such leaned mask profile may have several advantages. Embodiments of the present application disclose double hardmask for multiple patterning processes that can reduce angle variation in the mask profiles and thereby improve the uniformity of the final features.

The methods described in this disclosure may advantageously enable etching vertical recesses with little to no mask learning and thereby achieve better uniformity, which may improve various self-aligned multiple patterning techniques, in particular in connection with fabricating small features using extreme ultraviolet (EUV) photolithography.

In the following, the issue of leaned mask profile during a conventional self-aligned double patterning (SADP) process is first described referring to FIGS. 1A-1C. The methods of double mask for a SADP process that overcome this issue of leaned mask profile in accordance with various embodiments are next described referring to FIGS. 2A-2I. Example process flow diagrams are illustrated in FIG. 3A-3C. All figures in this disclosure are drawn for illustration purpose only and not to scale, including the aspect ratios of features. Although the description below in this disclosure is described mainly for a SADP process, the methods herein may also be applied to any multiple patterning techniques where a leaned mask profile may occur, including self-aligned quadruple patterning (SAQP).

FIGS. 1A-1C illustrate cross-sectional views of an example substrate 100 during a conventional self-aligned double patterning (SADP) process at various stages.

FIG. 1A illustrates a cross-sectional view of the incoming substrate 100 with tapered sidewall spacers 140 formed over a layer stack comprising an underlying layer 110, an adhesion layer 120, and a hardmask layer 130. In a conventional SADP process, a spacer material may be deposited over a mandrel to cover the top surface and the sidewalls of the mandrel, followed by one or more etch processes to remove the top portion of the spacer material and the mandrel to form the sidewall spacers 140 that are free-standing as illustrated in FIG. 1A. Because these etch processes may proceed asymmetrically on the two sides of the sidewall spacers 140, the sidewall spacers 140 may often have tapered shapes, for example, with one group of the sidewall spacers 140 has a top surface oblique to the left and another group of the sidewall spacers 140 has a top surface oblique to the right.

FIG. 1B illustrates a cross-sectional view of the substrate 100 after patterning the hardmask layer 130. When a subsequent pattern transfer etch is performed to etch the hardmask layer 130, the tapered shapes of the sidewall spacers 140 may cause mask leaning as illustrated in FIG. 1B. For example, a mask derived from a sidewall spacer on the left sidewall of the mandrel (on the left in FIG. 1B) may lean to the right (inward) and another mask derived from another sidewall spacer on the right sidewall of the mandrel (on the right in FIG. 1B) may lean to the left (inward). Consequently, the recesses between the masks may have wide and narrow openings in an alternating fashion.

FIG. 1C illustrates a cross-sectional view of the substrate 100 after patterning the underlying layer 110. The leaned mask profile described above leads to issues of non-uniformity during etching the underlying layer 110 because one recess may be extended faster than an adjacent recess. As illustrated in FIG. 1C, the inventors of this application have identified that the resulting feature may therefore suffer non-ideality such as critical dimension (CD) variations and recess depth variation. In addition, the leaned mask profile may also cause pitch walking and line edge roughness (LER) among others. The methods of double mask in accordance with various embodiments as described in detail below may advantageously overcome these issues by correcting the lean mask profile through additional mask layers inserted between the sidewall spacers 140 and the hardmask layer 130.

FIGS. 2A-2I illustrate cross-sectional views of an example substrate 200 during a SADP process utilizing double hardmask at various stages of processing in accordance with various embodiments. FIG. 2A illustrates a cross-sectional view of the incoming substrate 200.

In FIG. 2A, the substrate 200 may be a part of, or includes, a semiconductor device, and may have undergone a number of steps of processing following, for example, a conventional process. The substrate 200 accordingly may comprise layers of semiconductors useful in various microelectronics. For example, the semiconductor structure may comprise the substrate 200 in which various device regions are formed.

In one or more embodiments, the substrate 200 may be a silicon wafer, or a silicon-on-insulator (SOI) wafer. In certain embodiments, the substrate 200 may comprise a silicon germanium wafer, silicon carbide wafer, gallium arsenide wafer, gallium nitride wafer and other compound semiconductors. In other embodiments, the substrate 200 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 2A, the substrate 200 may comprise an underlying layer 210 over the substrate 200. In various embodiments, the underlying layer 210 is a target layer that is to be patterned for semiconductor device fabrication. In certain embodiments, the feature being etched into the underlying layer 210 may be a contact hole, slit, or other suitable structures comprising a recess. The underlying layer 210 may comprise an oxide, amorphous silicon, polysilicon, or other dielectric materials useful in semiconductor fabrication. The underlying layer 210 may comprise a low-k dielectric material in some example, and may be a porous material. In one embodiment, the underlying layer 210 may be a silicon oxide layer. In another embodiment, the underlying layer 210 may comprise a silicon oxide prepared by plasma-enhanced CVD or flowable CVD using tetraethyl orthosilicate (TEOS) as a precursor. The material layer 210 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the material layer 210 has a thickness between 5 nm to 10 µm.

Over the underlying layer 210, an adhesion layer 220 may be formed in order to facilitate the subsequent deposition of a lower hardmask layer 230. In various embodiments, the adhesion layer 220 may comprise an oxide or other materials such as silicon carbon nitride (SiCN). The adhesion layer 220 may be deposited using an appropriate technique such as vapor deposition as described above for the underlying layer 210.

Various embodiments of the methods of double hardmask disclosed in this disclosure may be particularly characterized by replacing a single hardmask layer (e.g., FIG. 1A) of a conventional method with a mask stack. As illustrated in FIG. 2A, the mask stack may comprise the lower hardmask layer 230, a middle mask layer 240, and an upper hardmask layer 250. As further described below, the use of mask stack may advantageously reduce or eliminate the issue of leaned mask profile through selective etch process to pattern each of the layers of the mask stack.

In various embodiments, the lower hardmask layer 230 and the upper hardmask layer 250 may be the same material. In various embodiments, the two layers may be metal-based hardmask layers. In certain embodiments, the two layers may both comprise a nitride. In one or more embodiments, the two layers may both comprise silicon nitride, titanium nitride, titanium, tantalum, tantalum nitride, tungsten based compounds, ruthenium based compounds, molybdenum based compounds, or aluminum based compounds.

The material for the middle mask layer 240 may be selected from a group of materials different from the lower hardmask layer 230 and the upper hardmask layer 250 in consideration of etch selectivity. In various embodiments, the middle mask layer 240 may comprise a non-metal mask material such as silicon oxide, silicon nitride, SiCN, SiOC, silicon oxynitride, silicon carbide, or Si.

As described above, in various embodiments, the lower hardmask layer 230 and the upper hardmask layer 250 may be selected from a group of nitride materials or metal-based materials, while the middle mask layer 24o may be selected from a group of oxide materials or silicon-based materials. The primary selection criterion is to provide sufficient etch selectivity, and therefore, in alternate embodiments, the selection between these layers may be exchanged; for example, the lower hardmask layer 230 and the upper hardmask layer 250 may comprise a non-metal mask material such as silicon oxide, silicon nitride, SiCN, SiOC, silicon oxynitride, silicon carbide, or Si, and the middle mask layer 24o may comprise tungsten based compounds, ruthenium based compounds, molybdenum based compounds, or aluminum based compounds.

The layers of the mask stack may be deposited using suitable deposition techniques such as vapor deposition including chemical vapor deposition (CVD), physical vapor deposition (PVD), as well as other plasma processes such as plasma enhanced CVD (PECVD), sputtering, and other processes including wet processes. One of the lower hardmask layer 230, the middle mask layer 240, and the upper hardmask layer 250 may have a thickness of about 5 nm to about 50 nm in various embodiments.

Over the mask stack, additional layers for forming an initial pattern by photolithography may be deposited. In various embodiments, the additional layers may comprise a mandrel layer 260, a spin on carbon (SOC) layer 270, an anti-reflective coating film (ARC) 272 such as silicon-containing ARC (SiARC), and a photoresist layer 274. The layers illustrated in FIG. 2A are for example only, and in other embodiments, the additional layers may include other layers or consist of fewer layers.

In one or more embodiments, the mandrel layer 260 comprises amorphous silicon, or any other type of sacrificial material known within the art. The mandrel layer 260 may also compromise a plasma polymerized organic film, spin on film or dielectric film. The mandrel layer 260 may have a desired height and width. In various embodiments, the ratio of the height to the width of the mandrel layer 260 (i.e., the aspect ratio) is between 2:1 to 20:1. In various embodiments, the mandrel layer 260 may have a height of about 10 nm to 1 µm, and in one embodiment about 40 nm to about 50 nm.

The initial pattern of the photoresist 274 may be generated by a conventional photolithographic process by exposing the substrate 200 to a UV radiation through a photomask and developing the photoresist 274. In certain embodiments, extreme ultraviolet (EUV) lithography may be used to pattern the photoresist 274, but in other embodiments, any other suitable lithographic technique may be used. In various embodiments, the initial pattern may be a line pattern, but any suitable pattern shape may be possible.

Figure 2B:
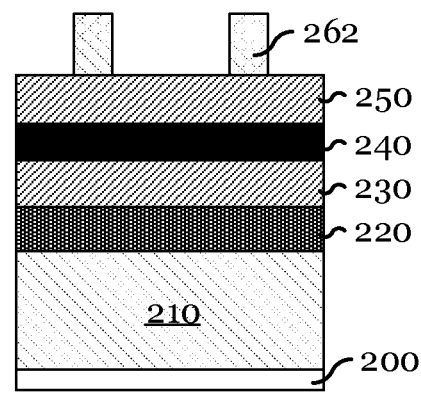
Figure 3A:
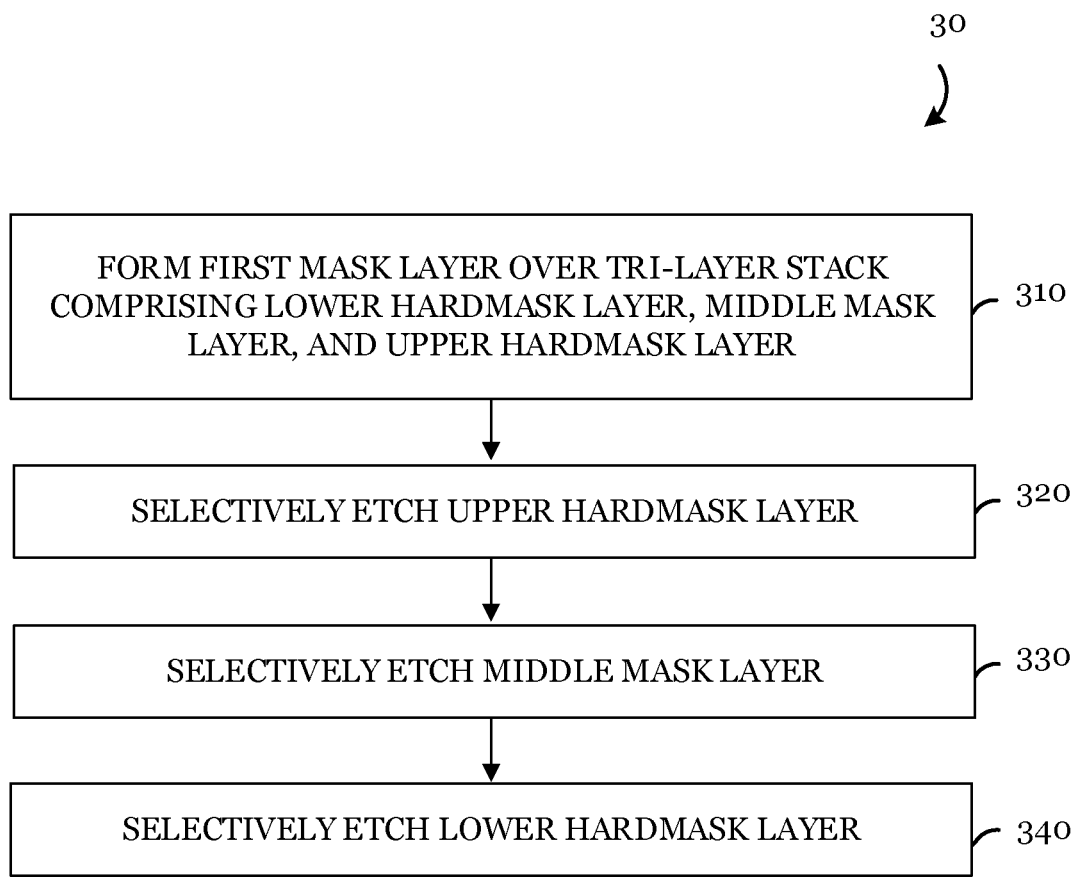
Figure 3B:
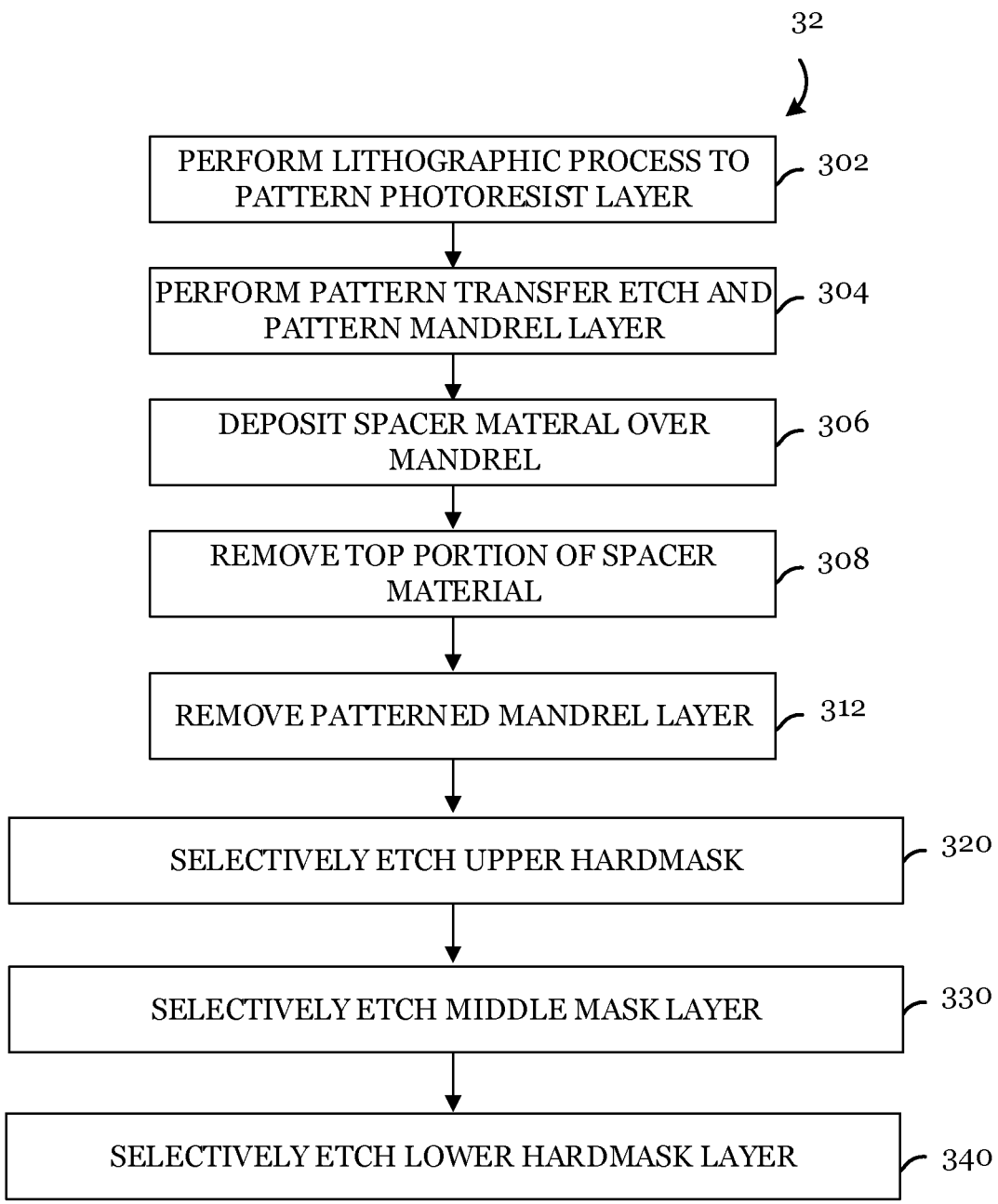
Figure 3C:
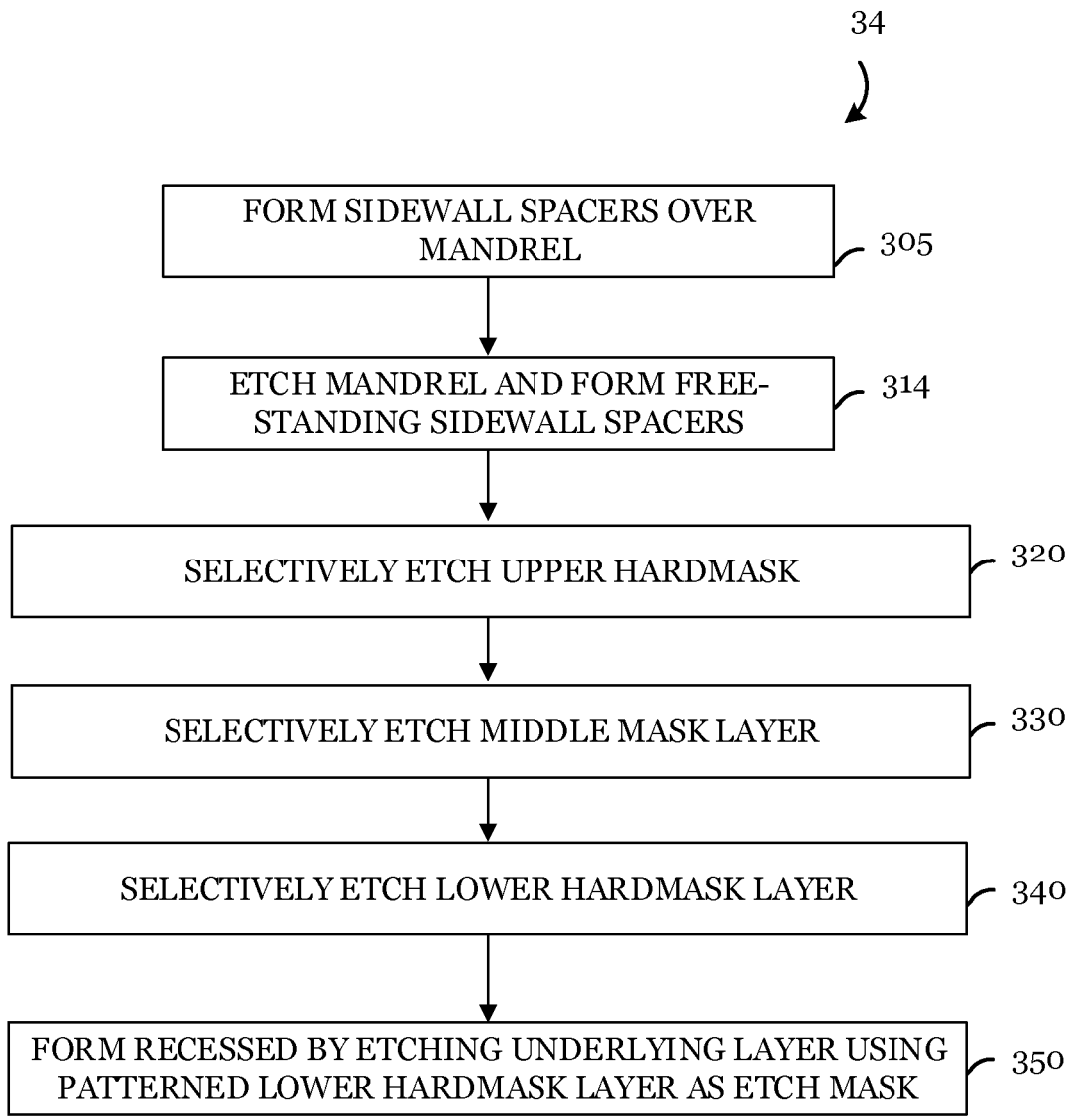

FIG. 2B illustrates a cross-sectional view of the substrate 200 after forming mandrels 262.

In FIG. 2B, the initial pattern of the photoresist 274 may be transferred into the mandrel layer 260 to form the mandrels 262 by an etch process such as reactive ion etch (RIE). In various embodiments, the critical dimensions (CD) of the mandrels 262 may be smaller than those of the photoresist 274 (e.g., FIG. 2A) through shrinking during the etch process. The target CD of the mandrels 262 may be selected in consideration of the quality of spacers to be formed on the sidewalls of the mandrels 262. In one or more embodiments, the mandrels 260 may have the CD of 5o nm or less. In one embodiment, the mandrels 260 may be formed with a pitch size of wo nm or less.

Figure 2C:
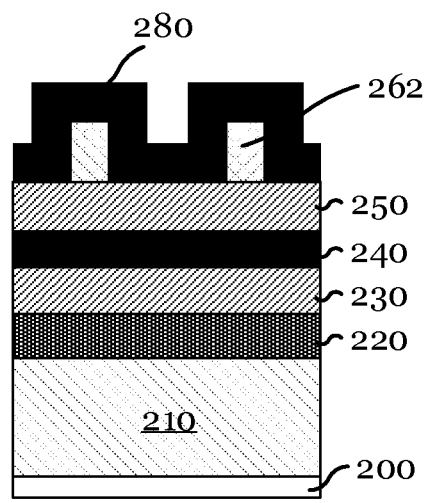

FIG. 2C illustrates a cross-sectional view of the substrate 200 after depositing a spacer material 280 over the mandrels 262.

In FIGS. 2C, a layer of the spacer material 280 is deposited over the substrate 200, conformally covering surfaces comprising the upper hardmask layer 250 and the mandrels 260. In various embodiments, the spacer material 280 may be deposited using a conformal deposition process such as atomic layer deposition (ALD) or any other conformal deposition technique used within semiconductor device fabrication. The spacer material 280 may comprise silicon oxide, silicon nitride, titanium nitride, titanium oxide, or any other type of oxide or insulating material known within the art. In various embodiments, the spacer material 280 is the same material as the middle mask layer 240 but different from the material of the mandrels 262, the lower hardmask layer 230, and the upper hardmask layer 250. Appropriate materials for these layers may be selected in consideration of etch selectivity and cost of fabrication. In one embodiments, the lower hardmask layer 230 and the upper hardmask layer 250 may both comprise silicon nitride, and the middle mask layer 240 and the spacer material 280 may both comprise silicon oxide in order to utilize the etch selectivity between the oxide and the nitride.

In certain embodiments, the thickness and CD of sidewall spacers to be produced from the spacer material 280 may be determined based on the thickness and CD of the mandrels 262 as well as the target final pitch. In one or more embodiments, the thickness of the layer of the spacer material 280 is between about 3 nm to about 40 nm. In one embodiment, the thickness of the layer of the spacer material 280 is approximately equal to the CD of the mandrels 262. Further, to enable the formation of sidewall spacers as described below, the thickness of the layer of the spacer material 280 is less than a half of the gap between the mandrels 262.

Figure 2D:
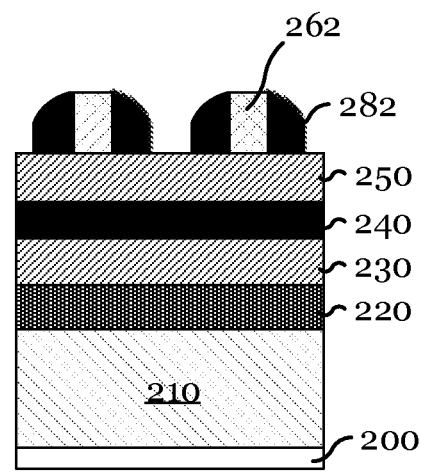

FIG. 2D illustrates a cross-sectional view of the substrate 200 after a top hat etch.

In FIGS. 2D, the spacer material 280 is etched by an anisotropic etching process, such as reactive ion etch (RIE). In this etch step, the spacer material 280 may be removed selectively from the substantially horizontal surfaces, thereby forming sidewall spacers 282 adhering to the near-vertical edges of the mandrels 262. The etch step is thus named as top hat etch. As illustrated in FIG. 2D, the gaps between the mandrels 262 after the top hat etch are narrowed by twice the thickness of the sidewall spacers 282. In various embodiments, the top hat etch may be timed to expose the top surfaces of the mandrels 262, the upper hardmask layer 250, or both. Alternatively, the top hat etch may be stopped at an optional underlying etch stop layer that may be deposited over the upper hardmask layer 250.

As already described referring to FIG. 1A above, due to the different etch rates at different locations of the features (e.g., near the mandrels 262 versus near the gap center), the sidewall spacers 282 may have tapered shapes instead of perfectly square shapes. For example, as illustrated in FIG. 2D, one group of the sidewall spacers 282 has a top surface oblique to the left and another group of the sidewall spacers 282 has a top surface oblique to the right, depending on the side of the mandrels 262 where the sidewall spacers 282 are adhering to.

Figure 2E:
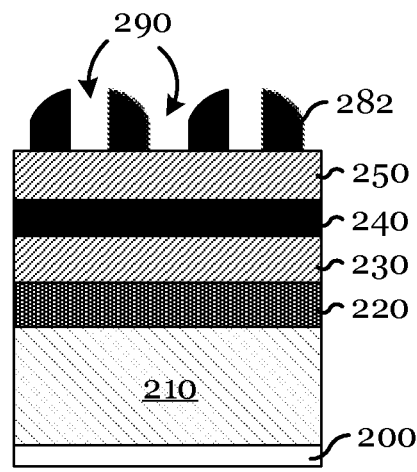

FIG. 2E illustrates a cross-sectional view of the substrate 200 after a mandrel pull etch.

In FIG. 2E, the mandrel pull etch may be performed by an anisotropic plasma etch process, such as reactive ion etch (RIE), to remove the mandrels 262. Alternately, the mandrel pull etch may be performed by a conventional wet etching process. As a result, the sidewall spacers 282 formed in the previous step (FIG. 2D) become free-standing and recesses 290 are formed. Because two free-standing sidewall spacers can be formed per mandrel, the feature size initially provided by the photolithography (i.e., the initial pattern of the photoresist 274 and that of mandrels 262) has been scaled down by about half.

In various embodiments, the recesses 290 may comprise a recess having a width between 5 nm to 300 nm. In certain embodiments, the width may be between 8 nm to 40 nm. In further embodiments, the aspect ratio of a recess (i.e., the height-to-width ratio) of the recesses 155 may be between 2:1 to 20:1. In various embodiments, the recesses 290 have critical dimensions required during a back end of line (BEOL) process for a semiconductor device at advanced nodes (e.g., pitch<24 nm). Although each of the recesses 290 is illustrated to have the same width with the same pitch to each other in FIG. 2E, in other embodiments, the recesses 290 may comprise recesses with more than one pitch and/or critical dimension.

Further in FIG. 2E, as described above, the sidewall spacers 282 may have tapered shapes, and thereby each of the sidewall spacers 282 may have a first sidewall and an opposite second sidewall, where the first sidewall has a different height from the second sidewall.

Figure 2F:
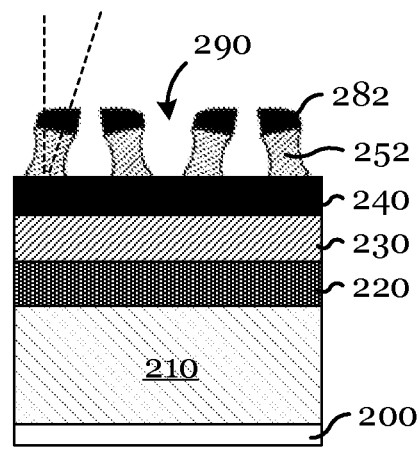

FIG. 2F illustrates a cross-sectional view of the substrate 200 after a first hardmask etch.

In FIG. 2F, the first hardmask etch may be performed by another anisotropic plasma etch process, such as reactive ion etch (RIE), to etch the upper hardmask layer 250 selectively to the sidewall spacers 282 and the middle mask layer 240. A portion of the sidewall spacers 282 may be consumed during the first hardmask etch. The recesses 290 are extended into patterned upper hardmask 252. In certain embodiments, similar to FIG. 1B, due to the tapered shapes of the sidewall spacers 282, one group of the patterned upper hardmask 252 may lean to the right and another group of the patterned upper hardmask 252 may lean to the left, as illustrated in FIG. 2F. The mask leaning is indicated by dotted lines in FIG. 2F. In certain embodiments, the mask leaning of the patterned upper hardmask 252 may be 10 degrees or more to the left or to the right relative to a vertical axis normal to a surface plane. In one embodiment, the mask learning may be about 15 degrees relative to the vertical axis. In further embodiments, the patterned upper hardmask 252 may have bowed or leaned sidewalls.

Figure 2G:
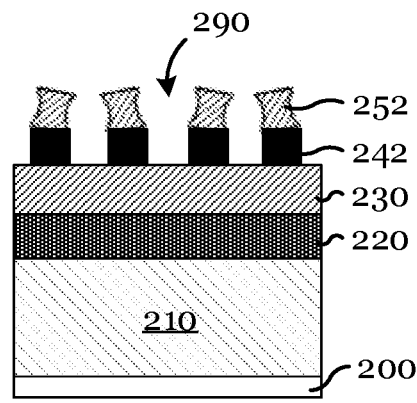

FIG. 2G illustrates a cross-sectional view of the substrate 200 after a middle mask etch.

In FIG. 2G, the middle mask etch may be performed by yet another anisotropic plasma etch process, such as reactive ion etch (RIE), to etch the middle mask layer 240 selectively to the upper hardmask 252 and the lower hardmask layer 230. In various embodiments, as previously described, the middle mask layer 240 and the spacer material of the sidewall spacer 282 may be the same material (e.g., silicon oxide). Accordingly, the middle mask etch, while forming patterned middle mask 242, also etches and may consume the remaining portion of the sidewall spacers 282. Consequently, the patterned middle mask 242 may have better uniformity across the substrate 200 compared to the sidewall spacers 282. Further, the mask leaning of the patterned middle mask 242 may be less than 10 degrees to the left or to the right relative to a vertical axis normal to a surface plane. In one embodiment, the mask leaning of the patterned middle mask 242 may be less than 5 degrees.

Figure 2H:
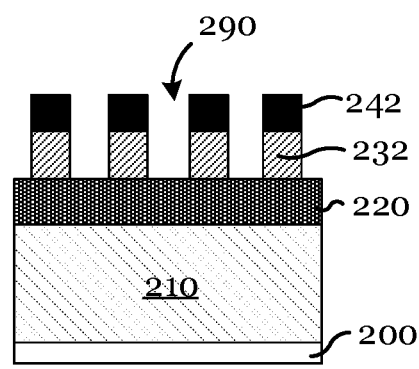

FIG. 2H illustrates a cross-sectional view of the substrate 200 after a second hardmask etch.

In FIG. 2H, a second hardmask etch may be performed by yet another anisotropic plasma etch process, such as reactive ion etch (RIE), to etch the lower hardmask layer 230 selectively to the patterned middle mask 242. In various embodiments, as previously described, the lower hardmask layer 230 and the upper hardmask layer 250 may be the same material (e.g., silicon nitride). Accordingly, the second hardmask etch, while forming patterned lower hardmask 232, also etches and may consume the remaining portion of the patterned upper hardmask 252.

In various embodiments, each etch step of the above described etch processes (i.e., the first hardmask etch, the middle mask etch, and the second hardmask etch) may be performed such that the uniformity of the feature is improved in the layer that is being patterned. In these embodiments, the initial non-uniformity of the sidewall spacers 282 such as mask leaning may be substantially reduced or completely eliminated by the end of the second hardmask etch, enabling a final pattern transfer etch with ideal etch profile with substantially vertical sidewalls. In one embodiment, for example, the initial learning observed in the sidewall spacers 282 of about 31 degrees relative to the vertical axis may be reduced, at each etch step, to 14 degrees in the patterned upper hardmask 252, 2 degrees in the patterned middle mask 242, and 0 degree in the patterned lower hardmask 232. Such embodiments may be enabled by selecting appropriate thickness for each layer of the layer stack, as etching high aspect ratio features may require a long process time and result in poor etch profiles.

Figure 2I:
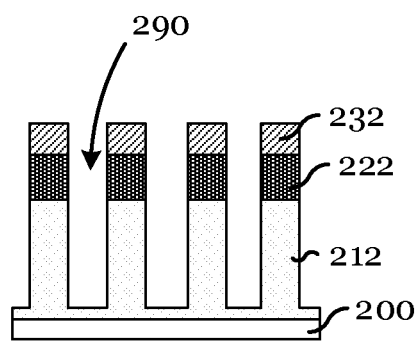

FIG. 2I illustrates a cross-sectional view of the substrate 200 after a final pattern transfer etch.

In FIG. 2I, the final pattern transfer etch may be performed by still another anisotropic plasma etch process, such as reactive ion etch (RIE). At this stage, remaining portions of the patterned middle mask 242 and the patterned lower hardmask 232 serve as the etch mask while etching the adhesion layer 220 and the underlying layer 210. The recesses 290 may be extended into the underlying layer 210 to form patterned adhesion layer 222 and patterned underlying layer 212.

In various embodiments, the methods of double hardmask described above may improve the uniformity of the final pattern transfer etch as a result of minimized mask leaning. Accordingly, in certain embodiments, high uniformity of the recesses 290 across the substrate 200 may be achieved, where a standard deviation of critical dimensions (CD) of the recesses 290 after the second hardmask etch may be less than 5%. In one embodiment, the CD deviation of the recesses 290 may be improved from 6 nm to 1 nm. Further, other parameters of the recesses 290 may also be improved compared to a conventional self-aligned double patterning (SADP) process that uses only one hardmask layer. For example, line edge roughness (LER) of the recesses 290 may be less than 2 nm. In addition, the uniform etch rate across the substrate 200 during the final pattern transfer etch may reduce the variation in the depth of the recesses 290 (e.g., FIG. 1C and FIG. 2I).

In various embodiments, various subsequent fabrication processes may follow. For example, in a back-end-of-line (BEOL) process, any remaining layers over the patterned underlying layer 212 may be removed and then metallization may be performed to form conductive lines/vias/supervias for a semiconductor device, followed by a planarization process.

FIGS. 3A-3C illustrate process flow charts of methods of double hardmask in accordance with various embodiments. The process flow can be followed with the figures (FIGS. 2A-2I) discussed above and hence will not be described again.

In FIG. 3A, a process flow 30 starts with forming a first mask layer over a mask stack comprising a lower hardmask layer, a middle mask layer, and an upper hardmask layer (block 310, FIGS. 2A-2E). Three etch processes are then performed as follows: (1) etching the upper hardmask layer selectively to the middle mask layer to transfer a pattern of the first mask layer to the upper hardmask layer (block 320, FIG. 2F); (2) etching the middle mask layer selectively to the lower hardmask layer and the patterned upper hardmask layer to transfer a pattern of the patterned upper hardmask layer to the middle mask layer (block 330, FIG. 2G); and (3) etching the lower hardmask layer selectively to the patterned middle mask layer to transfer a pattern of the patterned middle mask layer to the lower hardmask layer (block 340, FIG. 2H).

In FIG. 3B, a process flow 32 starts with performing a lithographic process to pattern a photoresist layer formed over a layer stack comprising a mandrel layer, a dielectric layer, and an anti-reflective coating (ARC) layer over the substrate (block 302, FIG. 2A). The substrate further comprises, below the layer stack, a lower hardmask layer, a middle mask layer, and an upper hardmask layer. Next, a pattern transfer etch is performed to etch through the dielectric layer and the ARC layer and pattern the mandrel layer (block 304, FIG. 2B), followed by depositing a spacer material over the patterned mandrel layer (block 306, FIG. 2C). Subsequently, a top portion of the deposited spacer material is removed to expose top surfaces of the patterned mandrel layer (block 308, FIG. 2D), followed by removing the patterned mandrel layer to form free-standing sidewall spacers (block 312, FIG. 2E). The pattern of the free-standing sidewall spacers is then transferred to the underlying layers as follows: (1) etching the upper hardmask layer selectively to the middle mask layer to transfer a pattern of the first mask layer to the upper hardmask layer (block 320, FIG. 2F); (2) etching the middle mask layer selectively to the lower hardmask layer and the patterned upper hardmask layer to transfer a pattern of the patterned upper hardmask layer to the middle mask layer (block 330, FIG. 2G); and (3) etching the lower hardmask layer selectively to the patterned middle mask layer to transfer a pattern of the patterned middle mask layer to the lower hardmask layer (block 340, FIG. 2H).

In FIG. 3C, a process flow 34 starts with forming sidewall spacers on sidewalls of a mandrel of the substrate formed over a mask stack comprising a lower hardmask layer, a middle mask layer, and an upper hardmask layer (block 305, FIG. 2D). Next, the mandrel is etched to make the sidewall spacers free-standing (block 314, FIG. 2E). The mask stack is then patterned as follows: (1) etching the upper hardmask layer selectively to the middle mask layer to transfer a pattern of the first mask layer to the upper hardmask layer (block 320, FIG. 2F); (2) etching the middle mask layer selectively to the lower hardmask layer and the patterned upper hardmask layer to transfer a pattern of the patterned upper hardmask layer to the middle mask layer (block 330, FIG. 2G); and (3) etching the lower hardmask layer selectively to the patterned middle mask layer to transfer a pattern of the patterned middle mask layer to the lower hardmask layer (block 340, FIG. 2H). Subsequently, recesses are formed in an underlying layer below the mask stack by etching the underlying layer using the patterned lower hardmask layer as an etch mask (block 350, FIG. 2I).

Example embodiments of the invention are summarized here. Other embodiments can also be understood from the entirety of the specification as well as the claims filed herein.

Example 1. A method of processing a substrate that includes: forming recesses in a first mask layer over a mask stack including a lower hardmask, a middle mask, and an upper hardmask, the recesses defining an initial pattern including a plurality of spacer structures, each of the spacer structures having a first sidewall and an opposite second sidewall, the first sidewall having a different height from the second sidewall; etching the upper hardmask, selectively to the middle mask, to transfer the initial pattern to the upper hardmask; etching the middle mask, selectively to the lower hardmask and the patterned upper hardmask, to transfer a pattern of the patterned upper hardmask to the middle mask; and etching the lower hardmask, selectively to the patterned middle mask, to transfer a pattern of the patterned middle mask to the lower hardmask.

Example 2. The method of example 1, where the patterned upper hardmask including a plurality of spaced apart portions, where, in a cross-sectional view, a first portion of the plurality of spaced apart portions extending from a major surface of the middle mask in a first direction and a second portion extending from the major surface of the middle mask in a second direction different from the first direction.

Example 3. The method of one of examples 1 or 2, where the lower hardmask and the upper hardmask are a same material, and the first mask layer and the middle mask are another same material, Example 4. The method of one of examples 1 to 3, where the patterned lower hardmask, etching the lower hardmask, includes a plurality of spaced apart lower hardmask portions, where, in a cross-sectional view, a first portion of the plurality of spaced apart lower hardmask portions extending from a major surface of the substrate in a third direction and a second portion extending from the major surface of the substrate in a fourth direction different from the third direction, and where the third direction is more vertical in the cross-sectional view than the first direction and the fourth direction is more vertical in the cross-sectional view than the second direction.

Example 5. The method of one of examples 1 to 4, where an angle between the first direction and the second direction is 180 degrees in a plan view.

Example 6. The method of one of examples 1 to 5, forming the recesses including: forming a mandrel over the mask stack; depositing a spacer material as the first mask layer over the mandrel; etching a top portion of the spacer material to expose the mandrel; and etching the mandrel to form free-standing sidewall spacers separated by the recesses.

Example 7. The method of one of examples 1 to 6, where etching the middle mask consumes all of the first mask layer.

Example 8. The method of one of examples 1 to 7, where etching the lower hardmask consumes all of the patterned upper hardmask.

Example 9. The method of one of examples 1 to 8, where the patterned mask and the middle mask both include SiO2.

Example 10. The method of one of examples 1 to 9, where the lower hardmask and the upper hardmask both include silicon nitride, titanium nitride, or tantalum nitride, tungsten based compounds, ruthenium based compounds, molybdenum based compounds, or aluminum based compounds.

Example 11. The method of one of examples 1 to 10, where the substrate further includes an underlying layer below the mask stack, the method further including forming recesses by etching the underlying layer using the patterned lower hardmask layer as an etch mask.

Example 12. A method of self-aligned multiple patterning that includes: performing a lithographic process to pattern a photoresist layer formed over a layer stack including a mandrel layer, a dielectric layer, and an anti-reflective coating (ARC) layer over the substrate, the substrate further including, below the mandrel layer, a lower hardmask layer, a middle mask layer, and an upper hardmask layer; performing a pattern transfer etch to etch through the dielectric layer and the ARC layer and pattern the mandrel layer; depositing a spacer material over the patterned mandrel layer; removing a top portion of the deposited spacer material to expose top surfaces of the patterned mandrel layer; removing the patterned mandrel layer to form free-standing sidewall spacers; etching the upper hardmask layer selectively to the middle mask layer and transfer a pattern of the free-standing sidewall spacers to the upper hardmask; etching the middle mask layer selectively to the lower hardmask layer and the patterned upper hardmask layer and transfer a pattern of the patterned upper hardmask layer to the middle mask layer; and etching the lower hardmask layer selectively to the patterned middle mask layer and transfer a pattern of the patterned middle mask layer to the lower hardmask layer.

Example 13. The method of example 12, where the lithographic process is an extreme ultraviolet (EUV) lithographic process.

Example 14. The method of one of examples 12 or 13, where the substrate further includes an underlying layer below the lower hardmask layer, the method further including forming recesses by etching the underlying layer using the patterned lower hardmask layer as an etch mask.

Example 15. The method of one of examples 12 to 14, where the recesses have critical dimensions less than a resolution limit of the EUV lithographic process.

Example 16. The method of one of examples 12 to 15, where the recesses have critical dimensions less than 20 nm and a standard deviation of the critical dimensions is less than 5%.

Example 17. A method of self-aligned multiple patterning that includes: forming sidewall spacers on sidewalls of a mandrel over the substrate, the mandrel formed over a mask stack including a lower hardmask layer, a middle mask layer, and an upper hardmask layer, the lower hardmask layer and the upper hardmask layer are a same material, the sidewall spacers and the middle mask layer are another same material; etching the mandrel to release the sidewall spacers to form free-standing sidewall spacers; etching the upper hardmask layer selectively to the middle mask layer and transfer a pattern of the free-standing sidewall spacers to the upper hardmask; etching the middle mask layer selectively to the lower hardmask layer and the patterned upper hardmask layer and transfer a pattern of the patterned upper hardmask layer to the middle mask layer; etching the lower hardmask layer selectively to the patterned middle mask layer and transfer a pattern of the patterned middle mask layer to the lower hardmask layer; and forming recesses by etching an underlying layer below the mask stack using the patterned lower hardmask layer as an etch mask.

Example 18. The method of example 17, where the same material includes an oxide and the other same material includes a nitride.

Example 19. The method of one of examples 17 or 18, where a standard deviation in critical dimensions of the recesses is smaller than a standard deviation in critical dimensions of the sidewall spacers.

Example 20. The method of one of examples 17 to 19, where the underlying layer includes a low-k dielectric material.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   forming recesses in a first mask layer over a mask stack comprising a lower hardmask, a middle mask, and an upper hardmask, the recesses defining an initial pattern comprising a plurality of spacer structures, each of the spacer structures having a first sidewall and an opposite second sidewall, the first sidewall having a different height from the opposite second sidewall, the lower hardmask and the upper hardmask comprising a metal-based mask material, and the middle mask comprising a silicon-based material;

etching the upper hardmask, selectively to the middle mask, to transfer the initial pattern to the upper hardmask;

etching the middle mask, selectively to the lower hardmask and the patterned upper hardmask, to transfer a pattern of the patterned upper hardmask to the middle mask; and etching the lower hardmask, selectively to the patterned middle mask, to transfer a pattern of the patterned middle mask to the lower hardmask, wherein etching the lower hardmask consumes all of the patterned upper hardmask.

2. The method of claim 1, wherein the patterned upper hardmask comprises a plurality of spaced apart portions, wherein, in a cross-sectional view, a first portion of the plurality of spaced apart portions extends from a major surface of the middle mask in a first direction and a second portion extends from the major surface of the middle mask in a second direction different from the first direction.

3. The method of claim 2, wherein the patterned lower hardmask comprises a plurality of spaced apart lower hardmask portions, wherein, in a cross-sectional view, a first portion of the plurality of spaced apart lower hardmask portions extends from a major surface of the substrate in a third direction and a second portion extends from the major surface of the substrate in a fourth direction different from the third direction, and wherein the third direction is more vertical in the cross-sectional view than the first direction and the fourth direction is more vertical in the cross-sectional view than the second direction.

4. The method of claim 1, wherein the lower hardmask and the upper hardmask are formed from a first material and wherein the first mask layer and the middle mask are formed from a second material that is different from the first material.

5. The method of claim 2, wherein an angle between the first direction and the second direction is 180 degrees in a plan view.

6. The method of claim 1, wherein forming the recesses comprises:

forming a mandrel over the mask stack;

depositing a spacer material as the first mask layer over the mandrel;

etching a top portion of the spacer material to expose the mandrel; and etching the mandrel to form free-standing sidewall spacers separated by the recesses.

7. The method of claim 1, wherein etching the middle mask consumes all of the first mask layer.

8. The method of claim 1, wherein the lower hardmask and the upper hardmask both comprise titanium nitride, tantalum nitride, tungsten based compounds, ruthenium based compounds, molybdenum based compounds, or aluminum based compounds.

9. The method of claim 1, wherein the substrate further comprises an underlying layer below the mask stack, the method further comprising forming recesses by etching the underlying layer using the patterned lower hardmask as an etch mask.

10. The method of claim 1, wherein line edge roughness of the recesses is less than 2 nm.

11. The method of claim 1, wherein the patterned middle mask has better uniformity across the substrate than the plurality of spacer structures.

12. A method of self-aligned multiple patterning, the method comprising:

performing a lithographic process to pattern a photoresist layer formed over a layer stack comprising a mandrel layer, a dielectric layer, and an anti-reflective coating (ARC) layer over a substrate, the substrate further comprising, below the mandrel layer, a lower hardmask layer, a middle mask layer, and an upper hardmask layer, the middle mask layer comprising a silicon-based material;

performing a pattern transfer etch to etch through the dielectric layer and the ARC layer and pattern the mandrel layer;

depositing a spacer material over the patterned mandrel layer;

removing a top portion of the deposited spacer material to expose top surfaces of the patterned mandrel layer;

removing the patterned mandrel layer to form free-standing sidewall spacers;

etching the upper hardmask layer selectively to the middle mask layer to transfer a pattern of the free-standing sidewall spacers to the upper hardmask layer;

etching the middle mask layer selectively to the lower hardmask layer and the patterned upper hardmask layer to transfer a pattern of the patterned upper hardmask layer to the middle mask layer; and etching the lower hardmask layer selectively to the patterned middle mask layer to transfer a pattern of the patterned middle mask layer to the lower hardmask layer, the etching the lower hardmask layer consuming the patterned upper hardmask layer in a single process.

13. The method of claim 12, wherein the lithographic process is an extreme ultraviolet (EUV) lithographic process.

14. The method of claim 13, wherein the substrate further comprises an underlying layer below the lower hardmask layer, the method further comprising forming recesses by etching the underlying layer using the patterned lower hardmask layer as an etch mask.

15. The method of claim 14, wherein the recesses have critical dimensions less than a resolution limit of the EUV lithographic process.

16. The method of claim 14, wherein the recesses have critical dimensions less than 20 nm and a standard deviation of the critical dimensions is less than 5%.

17. A method of self-aligned multiple patterning, the method comprising:

forming sidewall spacers on sidewalls of a mandrel over a substrate, the mandrel formed over a mask stack comprising a lower hardmask layer, a middle mask layer, and an upper hardmask layer, wherein the lower hardmask layer and the upper hardmask layer are formed by a first material and the sidewall spacers and the middle mask layer are formed by a second material that is different from the first material, the first material being a metal-based material and the second material being a silicon-based material;

etching the mandrel to release the sidewall spacers to form free-standing sidewall spacers;

etching the upper hardmask layer selectively to the middle mask layer to transfer a pattern of the free-standing sidewall spacers to the upper hardmask layer;

etching the middle mask layer selectively to the lower hardmask layer and the patterned upper hardmask layer to transfer a pattern of the patterned upper hardmask layer to the middle mask layer;

etching the lower hardmask layer selectively to the patterned middle mask layer to transfer a pattern of the patterned middle mask layer to the lower hardmask layer, the patterned upper hardmask layer being removed by etching the lower hardmask layer; and forming recesses by etching an underlying layer below the mask stack using the patterned lower hardmask layer as an etch mask.

18. The method of claim 17, wherein the first material comprises a nitride and the second material comprises an oxide.

19. The method of claim 17, wherein a standard deviation in critical dimensions of the recesses is smaller than a standard deviation in critical dimensions of the sidewall spacers.

20. The method of claim 17, wherein the underlying layer comprises a low-k dielectric material.

* * * * *